US006054366A

United States Patent [19]

Yamagishi et al.

[11] Patent Number: 6,054,366

[45] Date of Patent: Apr. 25, 2000

[54] TWO-LAYERED GATE STRUCTURE FOR A SEMICONDUCTOR DEVICE AND METHOD FOR PRODUCING THE SAME

[75] Inventors: Machio Yamagishi; Takashi Shimada, both of Kanagawa, Japan

[73] Assignee: Sony Corporation, Tokyo, Japan

[21] Appl. No.: 09/033,468

[22] Filed: Mar. 2, 1998

Related U.S. Application Data

[62] Division of application No. 08/872,804, Jun. 10, 1997, Pat. No. 5,808,339, and a division of application No. 08/345,719, Nov. 22, 1994, abandoned.

[30] Foreign Application Priority Data

Nov. 24, 1993 [JP] Japan .............................. P05-319090
Mar. 4, 1994 [JP] Japan .............................. P06-060021

[51] Int. Cl.[7] .............................. H01L 29/78; H01L 21/10

[52] U.S. Cl. .............................. 438/443; 438/225; 257/316; 257/324; 257/326; 257/508

[58] Field of Search .............................. 438/443, 225, 438/297; 257/316, 324, 326, 508

[56] References Cited

U.S. PATENT DOCUMENTS

| | | | |
|---|---|---|---|
| 4,539,744 | 9/1985 | Burton | 438/443 |
| 5,036,375 | 7/1991 | Mitchell | 257/316 |
| 5,312,770 | 5/1994 | Pasch | 438/443 |
| 5,472,892 | 12/1995 | Gwen et al. | 257/316 |
| 5,882,985 | 10/1995 | Wang et al. | 438/443 |

*Primary Examiner*—Charles Bowers
*Assistant Examiner*—David S Blum
*Attorney, Agent, or Firm*—Hill & Simpson

[57] ABSTRACT

In order to avoid any concentration of an electric field to gate edges of a two-layered structure and to improve an accumulation performance of charge, a semiconductor device includes a semiconductor substrate; an element isolation region formed to define an element formation region in the semiconductor substrate; a first gate insulating layer formed in a part of a surface of the element formation region; a first gate electrode formed on the first gate insulating layer; an insulating layer for surrounding the first gate electrode with a top surface of the insulating layer being substantially in the same plane as that of a top surface of the first electrode; a second gate insulating layer formed on the first gate electrode; and a second gate electrode formed on the second gate insulating layer. Also, a method therefor is provided.

3 Claims, 11 Drawing Sheets

10
15
16
17
18
14
16a
11a
14
13a
13a
13
13
12
11

TWO-LAYERED GATE STRUCTURE FOR A SEMICONDUCTOR DEVICE AND METHOD FOR PRODUCING THE SAME

This application is a division of Ser. No. 08/872,804 filed Jun. 10, 1997 now U.S. Pat. No. 5,808,339 and a division of Ser. No. 08/345,719 filed Nov. 22, 1994, abandoned.

BACKGROUND OF THE INVENTION

The present invention relates to a two-layered gate structure of a semiconductor device in which gates are structured into two layers, and a non-volatile storage element in which the structure is used. It also relates to a method for manufacturing the two-layered structure.

A conventional two-layered gate structure for a non-volatile storage element will now be described by way of example with reference to FIG. 1.

As shown in FIG. 1, an element isolation region 113 is formed on a peripheral surface of an element formation region 112 set in a semiconductor substrate 111. This element isolation region 113 is formed through a LOCOS method, and its top surface is raised from the surface of the semiconductor substrate 111.

Also, a first gate insulating layer 114 is formed on the top surface of the element formation region 112 of the semiconductor substrate 111. A first gate electrode (i.e., floating gate electrode) 115 is formed so as to overlap over a part of a top portion of the element isolation region 113.

A second gate insulating layer 116 is further formed on the top surface of the above-described first gate electrode 115. A second gate electrode (i.e., control gate electrode) 117 is formed so as to overlap over the first gate electrode 115 of the second gate insulating layer 116.

Also, source/drain regions (not shown) are formed on both sides of the first gate electrode 115.

The two-layered structure is formed in the semiconductor device 101 in the first conventional case as described above.

A method for producing the two-layered gate structure of the semiconductor device 101 will now be described with reference to FIGS. 2A to 2C in which the same reference numerals are used to designate the same components as shown in FIG. 1.

As shown in FIG. 2A, the element isolation region 113 is formed on the semiconductor substrate 111 in accordance with a LOCOS method. Subsequently, after a first insulating layer 121 has been formed on the element formation region 112, a first electrode formation layer 122 is formed over an entire top surface thereof.

Then, as shown in FIG. 2B, the first electrode formation layer 122 is patterned to form an electrode pattern 123 through a lithography and an etching technology. A second insulating layer 124 and a second electrode formation layer 125 are formed to cover the electrode pattern 123.

Thereafter, as shown in FIG. 2C, the second gate electrode 117 is formed by the second electrode formation layer 125 and the second gate insulating layer 116 is formed by the second insulating layer 124 in accordance with the lithography and the etching technology. Furthermore, the first gate electrode 115 is formed by the electrode pattern 123. Then, the first insulating layer becomes the first gate insulating layer 114.

However, as shown in FIG. 1, in the case where the two-layered gate structure of the semiconductor device 101 of the first conventional example is applied to a non-volatile memory device, for example, since both the upper end portions 115*a* and 115*b* of the first electrode 115 are sharply or angularly formed into edges, when a high voltage (of, for example, about 15 to 25V) is applied to the second gate electrode (i.e., control gate electrode) 117, an electric field will be concentrated on both the upper end portions 115*a* and 115*b*. As a result, electrons accumulated in the first gate electrode 115 will be removed. Since an amount of charge accumulated in the first gate electrode 115 is changed in case of such a phenomenon, an amount of memory information therein would be changed. Accordingly, it is safe to say that the data holding performance would be low in such a structure.

Also, in the method for producing the semiconductor device, after the first gate electrode has been formed by patterning the first electrode formation layer, the second gate insulating layer and the second gate electrode are formed to cover the first gate electrode in a gate width direction. For this reason, the second gate insulating layer and the second gate electrode are formed on the stepped portions formed in the first gate electrode.

SUMMARY OF THE INVENTION

An object of the present invention is to provide a two-layered structure for a semiconductor device and a method for producing the same in which a capacitance between a first gate electrode and a second gate electrode is kept at a satisfactory level and there is no concentration of an electric field at corner edge portions on both side of the first gate electrode.

Another object of the present invention is to provide a two-layered structure for a non-volatile semiconductor element and a method for producing the same in which a capacitance between a first gate electrode and a second gate electrode is kept at a satisfactory level and there is no concentration of an electric field at corner edge portions on both side of the first gate electrode.

In order to attain these and other objects, according to the present invention, a semiconductor device comprising:

- a semiconductor substrate;
- an element isolation region formed to define an element formation region in the semiconductor substrate;
- a first gate insulating layer formed in a part of a surface of the element formation region;
- a first gate electrode formed on the first gate insulating layer;
- an insulating layer for surrounding the first gate electrode with a top surface of the insulating layer being substantially in the same plane as that of a top surface of the first electrode;
- a second gate insulating layer formed on the first gate electrode; and
- a second gate electrode formed on the second gate insulating layer.

According to an inventive concept of the invention, any edges of the electrode such as a floating gate or the like are not located on the element isolation layer. It is preferable that the insulating layer for surrounding the first gate electrode should have vertical edges.

The element isolation may be an oxidized layer formed on a surface of the semiconductor substrate.

The first gate electrode is a floating electrode and the second gate electrode is a control electrode.

The top surface of the element isolation region is kept substantially at the same level as that of the semiconductor substrate, and the insulating layer comprises at least a planarizing insulating layer formed in a gate width direction of the first gate electrode.

The element isolation region may include a trench formed in the semiconductor substrate.

The first gate electrode may be formed within a stepped portion formed in a part of the element isolation region.

According to another aspect of the present invention, there is provided a method for producing a semiconductor device, comprising the following steps of:

(a) after an element isolation region is formed around an element formation region on a top layer of the element formation region formed in a semiconductor substrate, forming a surface of the semiconductor substrate and a surface of the element isolation region which are substantially flush with each other;

(b) forming a first insulating layer at least on the element formation region;

(c) after forming a first electrode formation layer on the first insulating layer, forming an electrode pattern by the first electrode formation layer on the element formation region;

(d) after forming a second insulating layer on the semiconductor substrate so as to cover the electrode pattern, removing a top layer of the second insulating layer until a top surface of the electrode pattern is substantially flush with a top surface of the second insulating layer, and forming a planarizing insulating layer by the second insulating layer;

(e) after forming a third insulating layer at least on the top surface of the electrode pattern, forming a second electrode formation layer on the third insulating layer; and (f) forming a second electrode by patterning the second electrode formation layer, subsequently forming a second gate insulating layer by patterning the third insulating layer, and thereafter, forming a first gate electrode by patterning the electrode pattern.

In the method according to the invention, after the completion of the steps (a), (b) and (c), the step (d) may include the following substep of, after the formation of the second insulating layer on the semiconductor substrate so as to cover the electrode pattern, removing a top layer of the second insulating layer by a chemical mechanical polishing until the top surface of the electrode pattern is substantially flush with the top surface of the second insulating layer to form the planarizing insulating layer by the second insulating layer, and after that, the steps (e) and (f) are carried out.

According to still another aspect of the invention, there is provided a method for producing a semiconductor device, comprising:

(a) forming an element isolation region around and on an element formation region formed in a semiconductor substrate;

(b) forming a stepped portion by removing an upper portion and/or a part of the element isolation region;

(c) forming a first gate insulating layer on the element formation region of the semiconductor substrate;

(d) after forming an electrode formation layer so as to cover the stepped portion and the first gate insulating layer, removing the first electrode formation layer by using the element isolation region as a stopper until a top surface of the first electrode formation layer is substantially flush with a top surface of the element isolation region;

(e) after forming an electrode interval insulating layer on the first electrode formation layer, forming a second electrode formation layer on the electrode space insulating layer; and (f) forming a second gate electrode by patterning the second electrode formation layer, subsequently forming a second gate insulating layer by patterning the electrode space insulating layer, and further forming a first gate electrode by patterning the first electrode formation layer.

In the thus described two-layered structure for the semiconductor device according to the present invention, the first gate electrode with the top surface flush with the top surface of the element isolation region is provided on the stepped portions formed by removing upper portions or parts of the element isolation region on the element formation region side. For this reason, the area of the top surface of the first gate electrode is increased, and therefore the capacitance between the first gate electrode and the second gate electrode is increased. Accordingly, it is possible to operate the semiconductor device even at a lower voltage applied to the second gate than that of the conventional case.

Also, since the top surface of the first electrode is substantially flush with the top surface of the element isolation region, it is possible to avoid the concentration of the electric field to the corner edge portions of the first gate electrode. Accordingly, it is possible to enhance the data holding capacity.

According to the method for producing the two-layered gate structure for the semiconductor device, after the stepped portions have been formed by removing the upper portions or parts of the element isolation region on the element formation region side, the first electrode formation layer is formed so as to be continuous with the stepped portions on the first electrode formation layer. Thereafter, the electrode insulating layer and the second electrode formation layer are formed on the first electrode formation layer, and then the patterning is effected to form the second gate electrode, the second gate insulating layer and the first gate electrode. For this reason, since the first gate electrode may be formed at the stepped portions of the element isolation region, it is possible to increase the area of the top surface of the first electrode.

Furthermore, after the first electrode formation layer has been formed so as to cover the stepped portions and the first gate insulating layer, the first electrode formation layer is removed while using the top surface of the element isolation region as a stopper until the top surface of the first electrode formation layer is substantially flush with the top surface of the element isolation region. It is therefore possible to form the top surfaces of the first gate electrode and the element isolation region substantially in a single plane.

As described above, according to one aspect of the invention, since the second gate insulating layer and the second gate electrode are formed on each top surface of the first gate electrode and the planarizing insulating layer which are substantially flush with each other, there is no concentration of the electric field to the upper corner portions of the first gate electrode on both sides. Also, since the second gate electrode and the wirings which are connected to the second gate electrodes are formed on the first gate electrode and the planarizing insulating layer which are substantially planarized are formed through the second gate insulating layer, there is no concentration of the electric field to the upper corner portions of the first gate electrode. As a result, since the accumulated charge amount in the first gate electrode will not change, it is possible to keep the charge holding performance at a higher level.

According to another aspect of the invention, since the above-described two-layered structure is used as the gates, there is no concentration of the electric field on the upper corner portions of the floating gate on both sides. For this reason, it is possible to enhance the charge holding performance to thereby enhance the data holding reliability.

According to still another aspect of the invention, the top layer of the second insulating layer is removed so that the surface of the electrode pattern which will become the first gate electrode is kept in the same level as that of the second insulating surface which covers the electrode pattern, the planarizing is carried out. Accordingly, it is possible to form the third insulating layer and the second electrode formation layer on the planar surface.

According to still another aspect of the invention, since the top layer of the second insulating layer is removed by the chemical mechanical polishing, it is possible to form the electrode pattern and the second insulating layer to be substantially flush with each other.

DESCRIPTION OF THE PREFERRED EMBODIMENTS

A two-layered structure according to the present invention will now be described with reference to a schematic view shown in FIG. 3.

Figure 1:
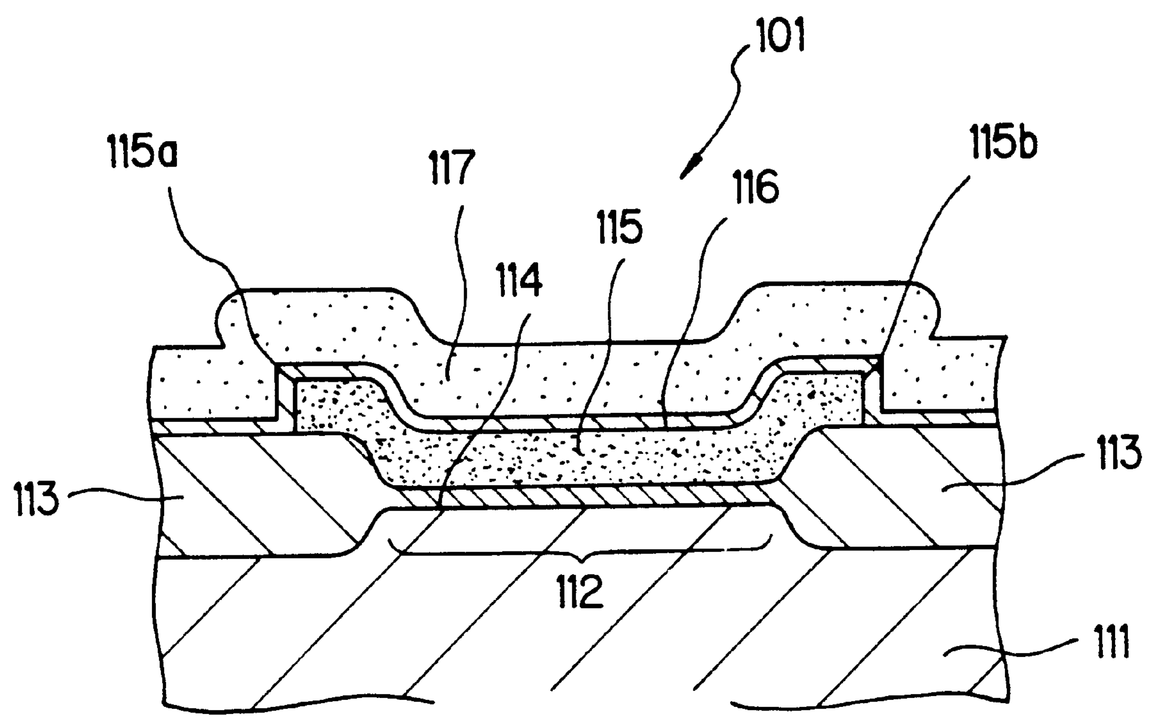
FIG. 1 is a schematic cross-sectional view showing a gate structure according to a conventional semiconductor device.
Figure 2A:
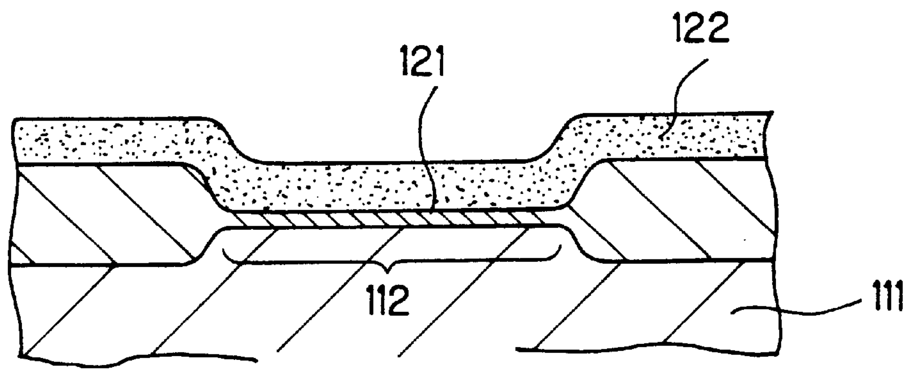
FIGS. 2A, 2B and 2C are cross-sectional view showing a method for producing the gate structure according to the conventional device.
Figure 2B:
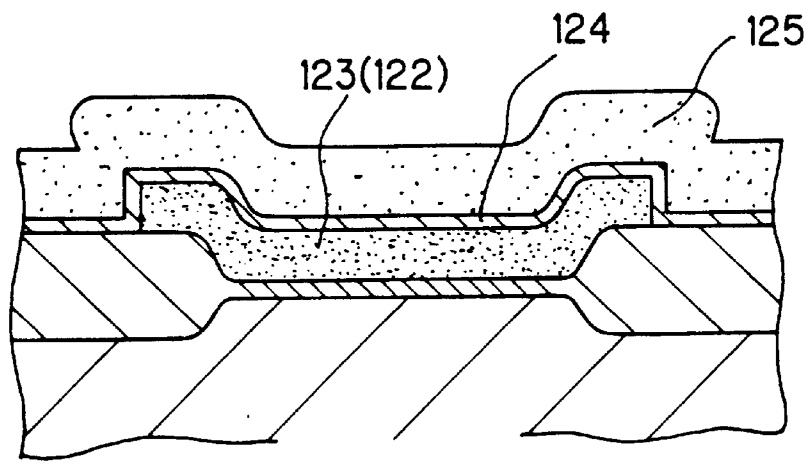
Figure 2C:
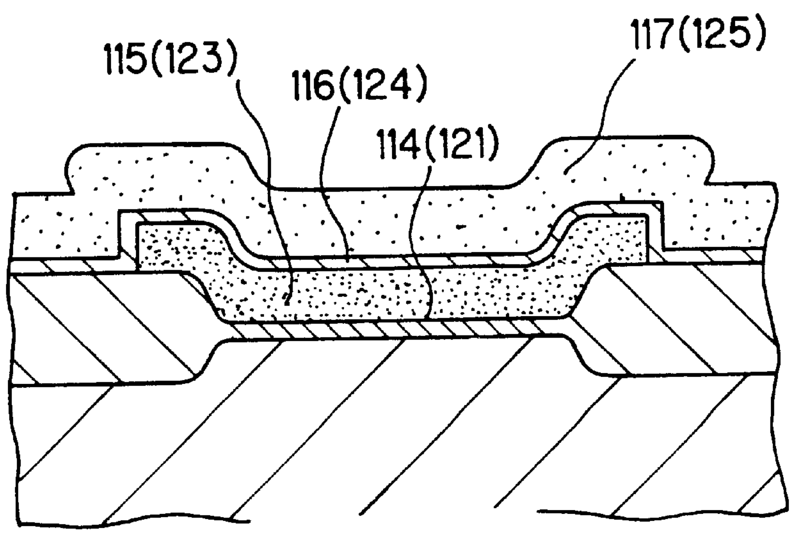
Figure 3:
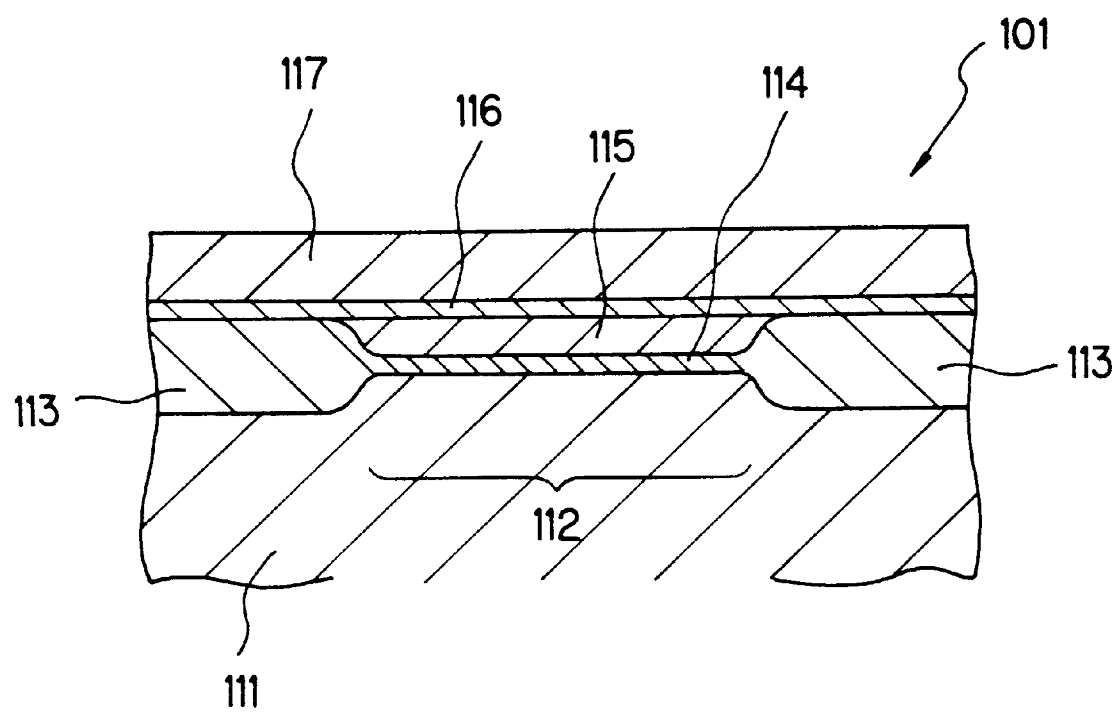
FIG. 3 is a schematic cross-sectional view showing a gate structure according to a semiconductor device according to the invention.

As shown in FIG. 3, an element isolation region 113 is formed on a peripheral surface of an element formation region 112 set in a semiconductor substrate 111. This element isolation region 113 is formed through the LOCOS method, and its top surface is raised from the surface of the semiconductor substrate 111.

A first gate insulating layer 114 is formed on the top surface of the element formation region 112 of the semiconductor substrate 111. A first gate electrode (i.e., floating gate electrode) 115 is formed so as to be substantially flush with a top portion of the element isolation region 113 on the first insulating layer 114.

Then, a second gate insulating layer 116 is further formed on the top surface of the above-described first gate electrode 115. A second gate electrode (i.e., control gate electrode) 117 is formed so as to overlap over the first gate electrode 115 of the second gate insulating layer 116.

The two-layered structure is formed in the semiconductor device 101 according to the present invention as described above.

However, as shown in FIG. 3, in the semiconductor device 101 of this embodiment, when the high voltage is applied to the second gate electrode 117, the amount of removal of the electrons from the first gate electrode 115 would be reduced. For this reason, the data holding performance would be kept at a high level. However, due to the fact that the top surface of the element isolation region 113 and the top surface of the first gate electrode 115 (i.e., floating gate electrode) are formed to be substantially flush with each other, the first gate 115 would not overlap on the element isolation region 113, as a result of which a surface area of the first gate electrode 115 would be small. For this reason, a capacitance formed between the semiconductor substrate 111 and the first gate electrode 115 and a capacitance formed between the first gate electrode 115 and the second gate electrode 117 (i.e., control gate electrode) would be relatively small. In particular, the capacitance defined between the first gate electrode 115 and the second gate electrode 117 would be small. As a result, unless a higher voltage would be applied to the second gate electrode 117, it would be impossible to write or erase the data due to Fowler-Nordheim tunnel effect.

Figure 4:
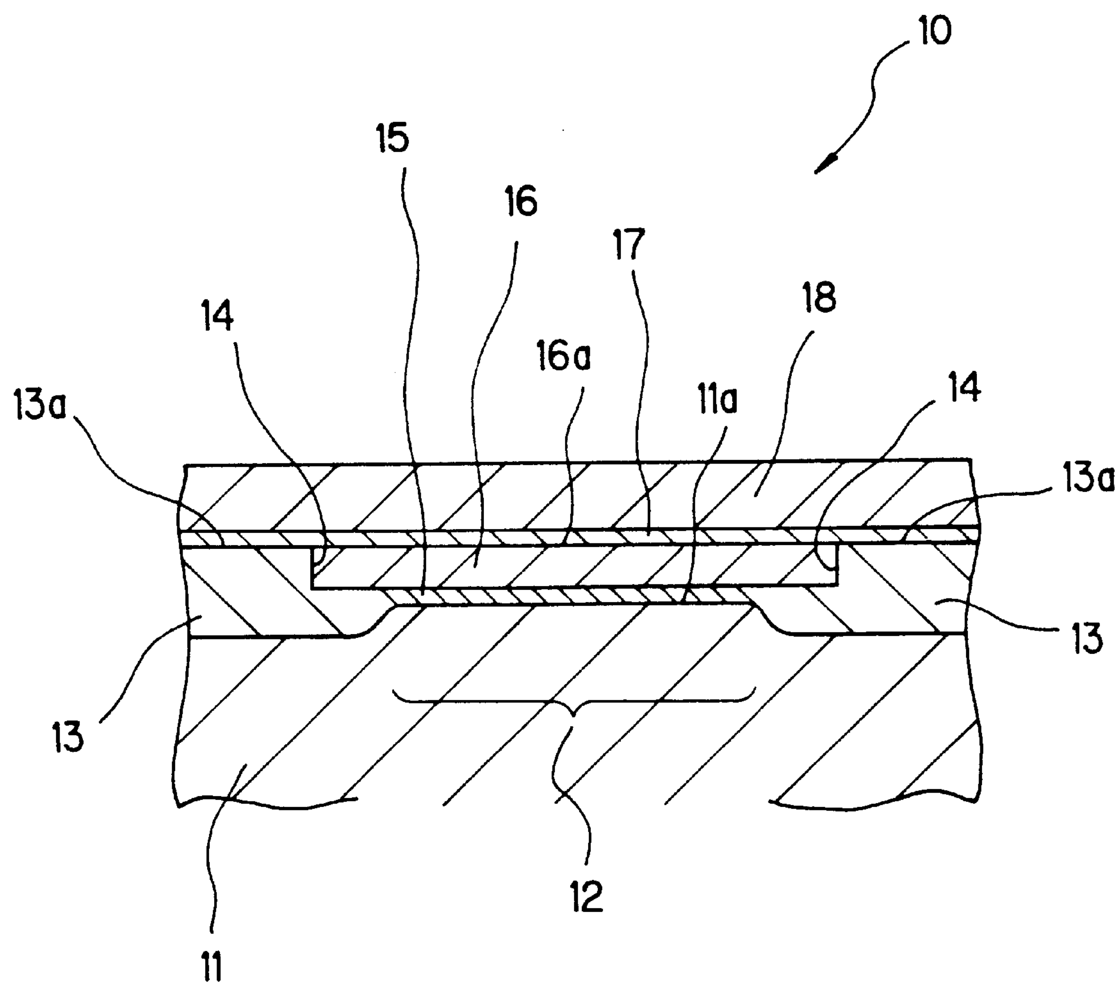
FIG. 4 is a schematic cross-sectional view showing a gate structure according to a first embodiment of the invention.

In view of this defect, another embodiment of the invention will now be described with reference to a schematic view shown in FIG. 4. In FIG. 4, there is shown a cross-section in a gate width direction.

As shown in FIG. 4, an element isolation region 13 is formed on a peripheral surface of an element formation region 12 set in a semiconductor substrate 11. A top surface 13*a* of the element isolation region 13 is formed so as to be raised from a top surface 11*a* of a semiconductor substrate 11. Stepped portions 14 are formed in top portions or parts of the element isolation region toward the element formation region 12.

A first gate insulating layer 15 is formed on the top surface of the element formation region 12 of the above-described semiconductor substrate 11. The first gate insulating layer 15 is made of a silicon oxide.

A first gate electrode 16 is continuously formed on the stepped portions 14 and the first gate insulating layer 15. Then, the top surface 13*a* of the above-described element isolation region 13 and the top surface 16*a* of the first gate electrode 16 are formed to be substantially flush with each other. Incidentally, the above-described first gate electrode 16 is made of, for example, polycrystalline silicon.

A second gate insulating layer 17 is formed on the top surface of the above-described first gate 16. The second gate insulating layer 17 is formed into a three-layered structure composed of, for example, a silicon oxide layer ($SiO_2$), a silicon nitride layer ($Si_3N_4$) and another silicon oxide layer ($SiO_2$). A second gate electrode 18 is formed on the top surface of the above-described second gate layer 17. The above-described second gate electrode 18 is made of, for example, polycrystalline silicon.

As described above, the two-layered gate structure for the semiconductor device 10 is thus formed with the first gate electrode 16 and the second gate electrode 18.

In the structure of the two-layered structure of the above-described semiconductor device 10, stepped portions 14 are formed in top portions or parts of the element isolation region 13 toward the element formation region 12. The first gate electrode 16 is formed on the stepped portions 14 and the first gate insulating layer 15. As a result, an area of the top surface of the first gate electrode 16 is large. Then, since the second gate insulating layer 17 and the second gate electrode 18 are laminated on the surface of the first gate electrode 16, a capacitance between the first gate electrode 16 and the second gate electrode 18 is increased. Accordingly, even if the voltage applied to the second gate electrode 18 would be low in comparison with that of the conventional structure, it is possible to operate the semiconductor device 10. For example, in the non-volatile memory device, even if a higher voltage would not be applied to the second gate electrode 18, it is possible to write or erase the data due to Fowler-Nordheim tunnel effect.

Also, since the top surface 16*a* of the first gate electrode 16 and the top surface 13*a* of the element isolation region 13 are formed to be substantially with each other, an electric field would not be concentrated on both end corner portions of the first gate electrode 13. For this reason, the data holding performance is enhanced.

A method for manufacturing the two-layered structure for the above-described semiconductor device 10 will now be described with reference to FIGS. 5A to 5C and FIGS. 6A to 6D. FIGS. 5A to 5C and FIGS. 6A to 6C are cross-sectional views of the semiconductor device in the gate width direction. FIG. 6D is a view of the semiconductor device in a gate longitudinal direction.

Figure 5A:
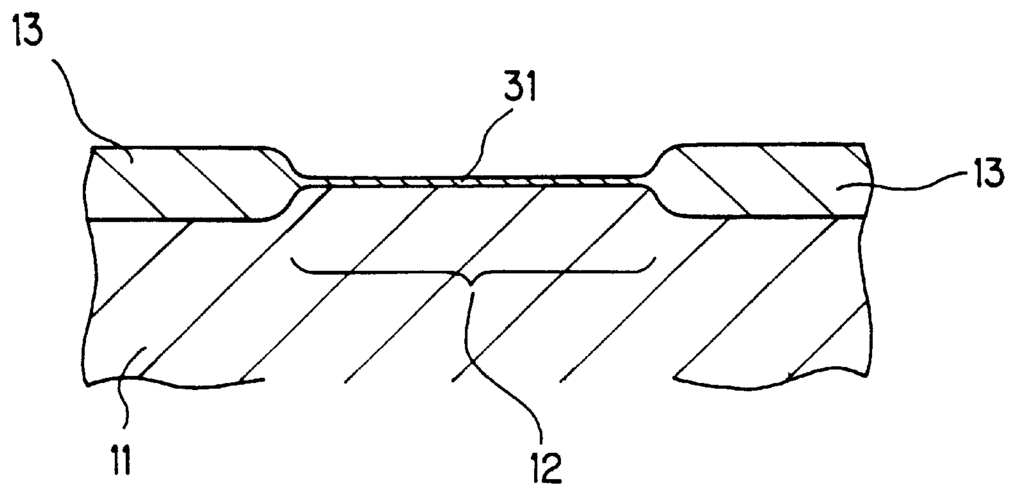
FIGS. 5A to 5C are cross-sectional views of the semiconductor device in the gate width direction which is produced according to a method of the invention.

As shown in FIG. 5A, in a first step, by, for example, the LOCOS method, the element isolation region 13 is formed on a top layer of the semiconductor substrate 11 around the element formation region 12 formed in the semiconductor substrate 11 so that the element isolation region 13 is kept a higher level than the surface of the top layer of the semiconductor substrate 11.

Thereafter, a silicon nitride layer (not shown) which has been used in the LOCOS method is removed. Accordingly, a silicon oxide layer 31 which has been used in the LOCOS method is left.

Figure 5B:
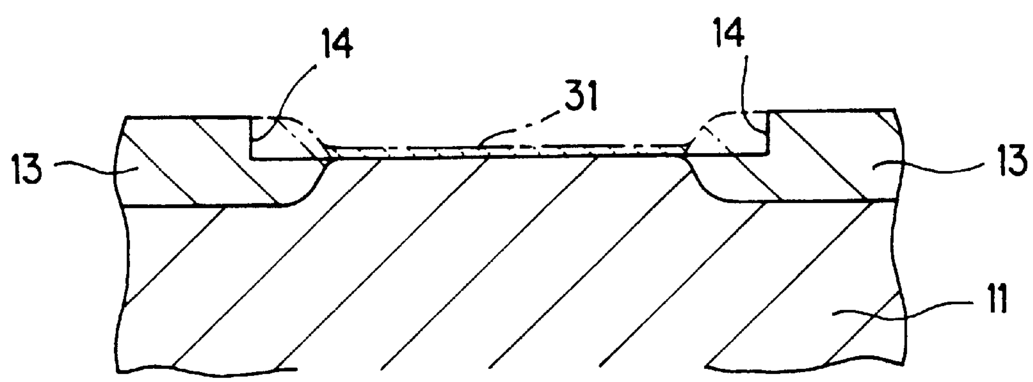

Subsequently, a second step shown in FIG. 5B is carried out. In this step, by a lithography and an etching process, upper portions (or parts) indicated by two-dotted and dash lines of the above-described element isolation region 13 on the side of the above-described element formation region 12 are removed to form stepped portions 14. In the etching process, the silicon oxide layer 31 which has been used in the LOCOS method and which is formed on the semiconductor substrate 11 is also removed. In this case, since the semiconductor substrate 11 is exposed, it is preferable to suppress a damage of the semiconductor substrate 11 caused by the etching process. Therefore, for instance, wet etching that would suppress a damage of the semiconductor substrate 11 is adopted as the above-described etching process. Of course, it is possible to carry out the above-described etching process by a dry etching method which causes less damage of the semiconductor substrate 11.

Figure 5C:
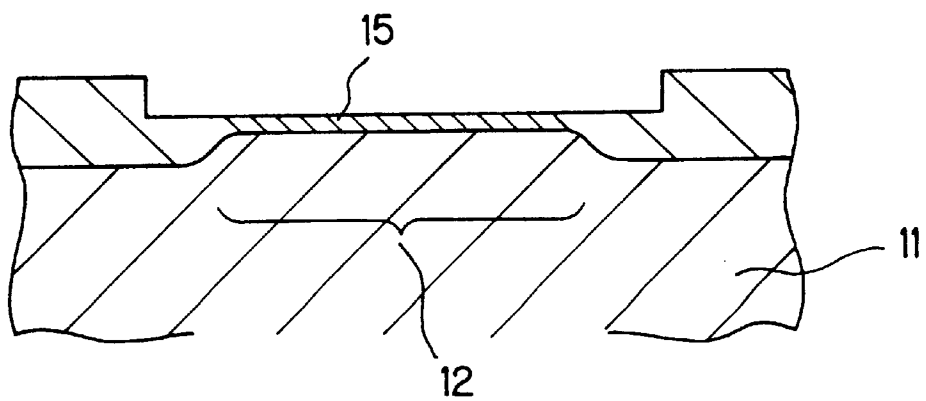

Next, a third step shown in FIG. 5C is carried out. In this step, by, for example, a heat oxidation method, a first gate insulating layer 15 is formed on the above-described element formation region 12 of the above-described semiconductor substrate 11.

Figure 6A:
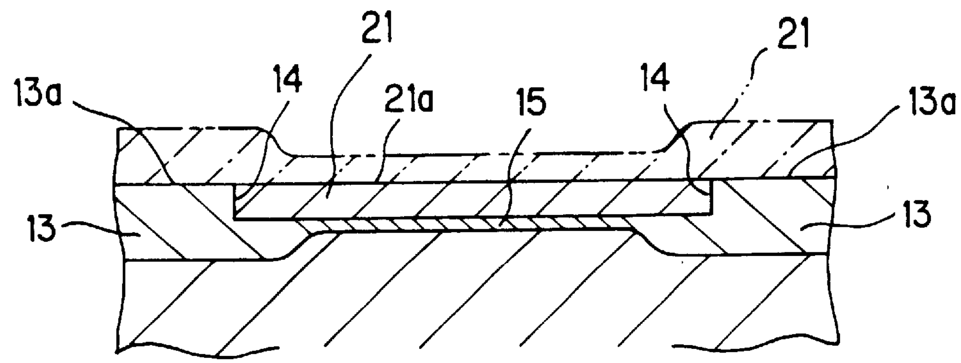
FIGS. 6A to 6C are cross-sectional views of the semiconductor device in the gate width direction which is subsequently produced according to the method of the invention.

Furthermore, a fourth step shown in FIG. 6A is carried out. In this step, by, for example, a CVD method, a first electrode formation layer 21 is formed so as to cover the above-described stepped portions 14 and the first gate insulating layer 15. The first electrode formation layer 21 is made of, for example, polycrystalline silicon.

Thereafter, by, for example, a polishing method, a portion, indicated by two-dotted and dash lines, of the first electrode formation layer 21 is polished and removed so that the top surface 13*a* of the element isolation region 13 is exposed. The first electrode formation layer 21 is left so that the top surface 13*a* of the above-described element isolation region 13 is substantially flush with the top surface 21*a* of the first electrode formation layer 21, and the latter is continuous on the first gate insulating layer 15 between the stepped portions 14. In this polishing step, the above-described element isolation region 13 is used as a polish stopper. Incidentally, the above-described polishing method is performed by, for example, a chemical polishing process. Of course, it is possible any other suitable precision polishing.

Also, of another planarizing method, for instance, after a planar layer (not shown) having substantially the same selection ratio of etching as that of the first electrode formation layer 21 has been formed on the first electrode formation layer 21, a regular etch-back process is carried out thereon. The planarizing layer is removed so as to expose the top surface 13*a* of element isolation region 13 and to remove the upper layer of the first electrode formation layer 21. Thus, as described in conjunction with the step shown in FIG. 6A, the first electrode formation layer 21 is left under the condition that the top surface 21*a* of the first electrode formation layer 21 is substantially flush with the top surface 13*a* of the element isolation region 13.

Figure 6B:
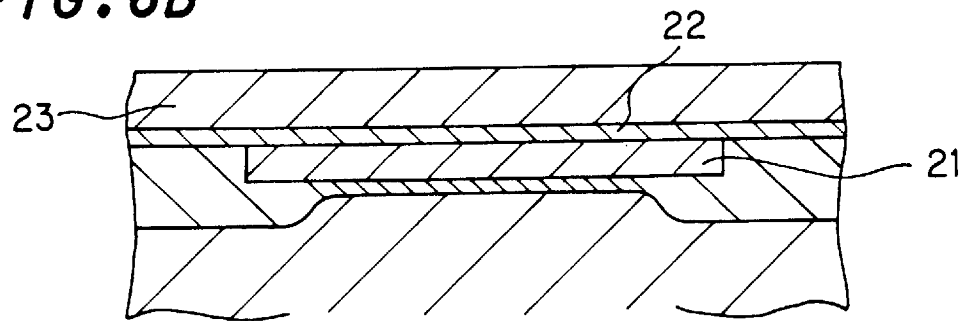

Subsequently, a fifth step shown in FIG. 6B is carried out. In this step, by, for example, a CVD method, an electrode interval insulating layer 22 is formed over an entire surface on the side of the first electrode formation layer 21. For instance, the electrode interval insulating layer 22 is formed in a three-layer structure composed of a silicon oxide layer ($SiO_2$), a silicon nitride layer ($Si_3N_4$) and another silicon oxide layer ($SiO_2$). Thereafter, by, for example, a CVD method, the second electrode-formation layer 23 is formed on the electrode interval insulating layer 22. The second electrode formation layer 22 is made of, for example, polycrystalline silicon.

Figure 6C:
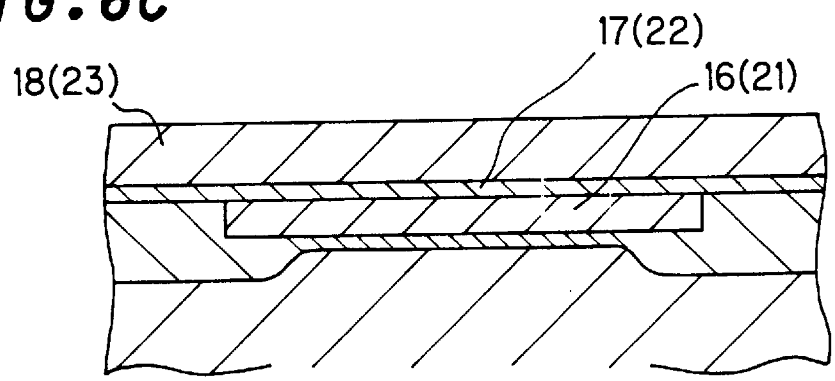
Figure 6D:
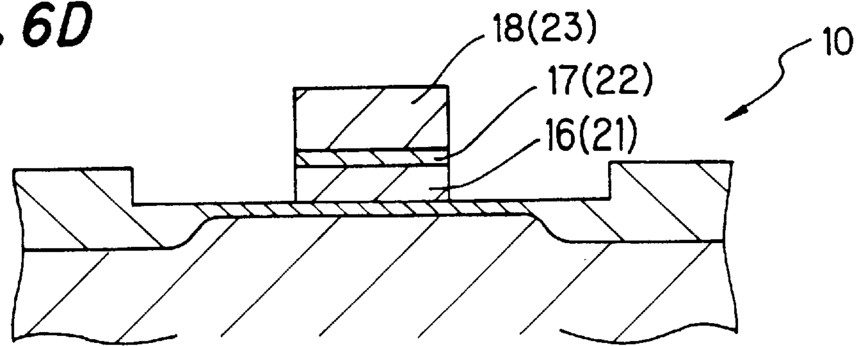
FIG. 6D is a view of the semiconductor device in a gate longitudinal direction, corresponding to FIG. 6C.

After that, a sixth step shown in FIGS. 6C and 6D is carried out. In this step, by a lithography and an etching process, the above-described second electrode formation layer 23 is patterned to form a second gate electrode 18. Subsequently, the above-described electrode interval insulating layer 22 is patterned to form a second gate insulating layer 17. Furthermore, the above-described first electrode formation region 21 is patterned to form a first gate electrode 16. Each of the patterning steps is carried out by using the same etching mask (not shown), for example.

Thus, the two-layered gate structure is formed for the semiconductor device 10.

Although not shown in the drawings, after the sixth step has been carried out, by, for example, an ion injection method, conductive impurities are introduced into the semiconductor substrate 11 on both sides of the above-described gate electrode 16 to form a source/drain structure. Subsequently, by a lithography and an etching process, a contact hole is formed in the layer interval insulating layer. Subsequently, by a wiring formation technique, a wiring is formed on the layer interval insulating layer.

In a method for manufacturing the two-layered gate structure for the semiconductor device 10, after the upper portions or parts of the element isolation region 13 on the side of the element formation region 12 have been removed to form the stepped portions 14, the first gate insulating layer 15 is formed, and further, the first electrode formation layer 21 is formed under the condition that it is continuous on the first gate insulating layer between the stepped portions 14. Thereafter, the electrode interval insulating layer 22 and the electrode formation layer 23 are formed on the first electrode formation layer 21 and then, the patterning is effected to form the second gate electrode 18, the second gate insulating layer 17 and the first gate electrode 16. Accordingly, since the first gate electrode 16 is formed at the stepped portions 14 on the element isolation region 13, the area of the first gate electrode 16 on its upper surface side is broader corresponding to the formation of the first gate electrode at the stepped portions 14 on the element isolation region 13.

Furthermore, after the formation of the first electrode formation layer 21 under the condition that it covers the first step portions 14 and the first gate insulating layer 15, the first electrode formation layer 21 is removed while using the top surface 13*a* of the element isolation region 13 as a stopper, until the top surface 21*a* of the first electrode formation layer 21 is substantially flush with the top surface 13*a* of the element isolation region 13. Accordingly, the top surface 16*a* of the first gate electrode 16 and the top surface 13*a* of the element isolation region 13 are formed substantially in a flat plane.

In the thus described two-layered structure for the semiconductor device according to the present invention, the first gate electrode with the top surface flush with the top surface of the element isolation region is provided on the stepped portions formed by removing upper portions or parts of the element isolation region on the element formation region side. For this reason, the area of the top surface of the first gate electrode is increased, and therefore the capacitance between the first gate electrode and the second gate electrode is increased. Accordingly, it is possible to operate the semiconductor device even at a lower voltage applied to the second gate than that of the conventional case.

Also, since the top surface of the first electrode is substantially flush with the top surface of the element isolation region, it is possible to avoid the concentration of the electric field to the corner edge portions of the first gate electrode. Accordingly, it is possible to enhance the data holding capacity.

According to the method for producing the two-layered gate structure for the semiconductor device, after the stepped portions have been formed by removing the upper portions or parts of the element isolation region on the element formation region side, the first electrode formation layer is formed so as to be continuous with the stepped portions on the first electrode formation layer. Thereafter, the electrode insulating layer and the second electrode formation layer are formed on the first electrode formation layer, and then the patterning is effected to form the second gate electrode, the second gate insulating layer and the first gate electrode. For this reason, since the first gate electrode may be formed at the stepped portions of the element isolation region, it is possible to increase the area of the top surface of the first electrode.

Furthermore, after the first electrode formation layer has been formed so as to cover the stepped portions and the first gate insulating layer, the first electrode formation layer is removed while using the top surface of the element isolation region as a stopper until the top surface of the first electrode formation layer is substantially flush with the top surface of the element isolation region. It is therefore possible to form the top surfaces of the first gate electrode and the element isolation region substantially in a single plane.

Figure 7:
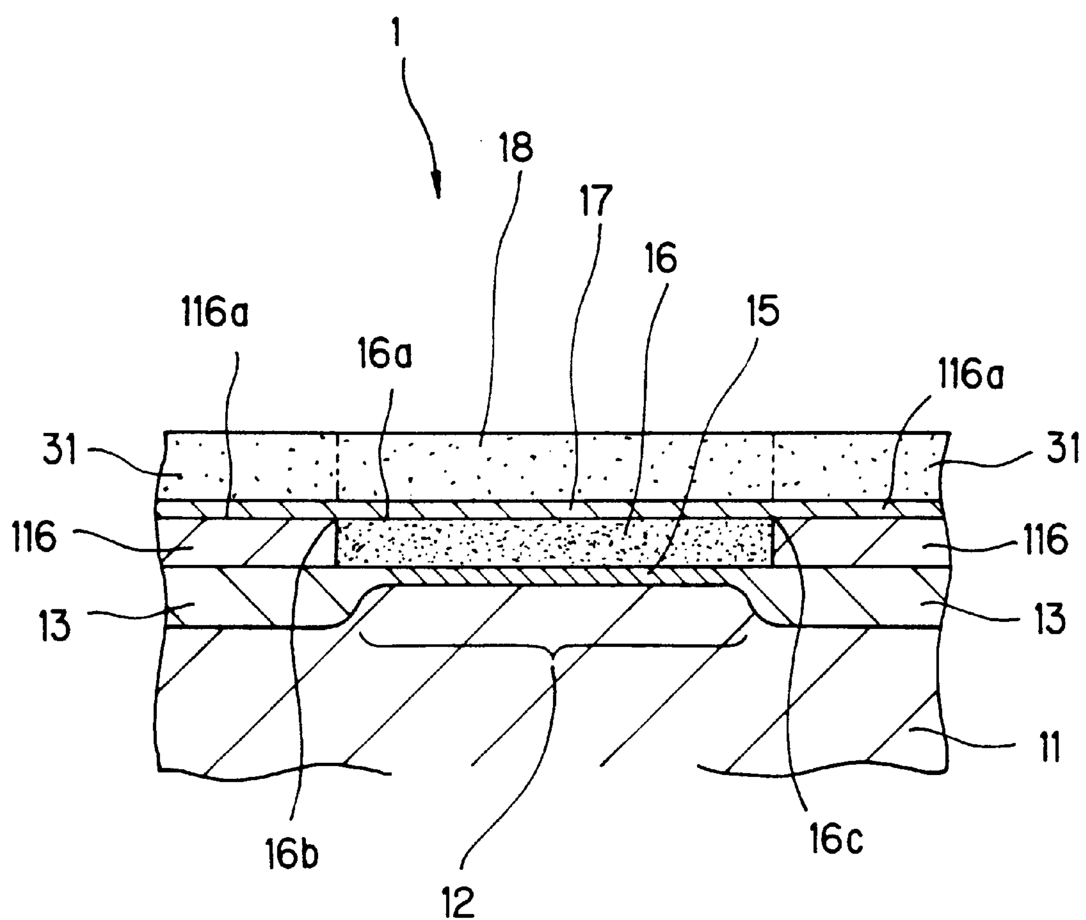
FIG. 7 is a schematic cross-sectional view showing a gate structure for a non-volatile storage element in a gate width direction according to a second embodiment of the invention.
Figure 8:
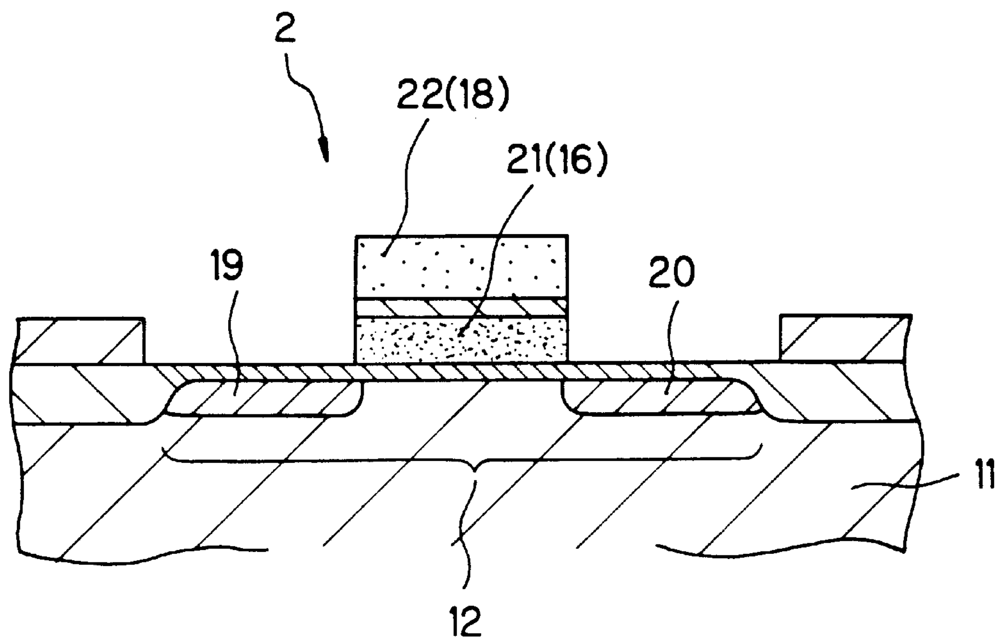
FIG. 8 is a schematic cross-sectional view showing the gate structure for the non-volatile storage element in a gate longitudinal direction shown in FIG. 7.

Another embodiment of the invention will now be described with reference to a schematic view shown in FIG. 7. In FIG. 7, there is shown a cross-section in a gate width direction.

As shown in FIG. 7, an element formation region 12 is set in a semiconductor substrate 11. An element isolation region 13 is formed on an outer periphery of the element formation region 12 on the semiconductor substrate 11. A top surface of the element isolation region 13 is formed substantially at the same level as a top surface of the semiconductor substrate 11.

Incidentally, FIG. 7 shows a state where the surface of the semiconductor substrate 11 is subjected to a heat oxidation treatment and hence does not show that the respective surfaces are formed at the same level.

A first gate insulating layer 15 is formed on a part of the top surface of the element formation region 12 so as to transverse the element formation region 12. The first gate insulating layer 15 is made of, for example, a silicon oxide.

A first gate electrode 16 is formed on the first gate insulating layer 15. The first gate electrode 16 is made of, for example, polycrystalline silicon.

A planarizing insulating layer 116 is formed at least in the gate width direction of the first gate electrode 16. A top surface 116*a* of the planarizing insulating layer 116 is formed substantially at the same level as that of a top surface 16*a* of the first gate electrode 16. A second gate insulating layer 17 and a second gate electrode 18 are laminated on the first gate electrode 15.

The second gate insulating layer 17 is formed into a three-layered structure (not shown) composed of, for example, a silicon oxide layer ($SiO_2$), a silicon nitride layer ($Si_3N_4$) and another silicon oxide layer ($SiO_2$). The second gate electrode 18 is made of, for example, polycrystalline silicon.

Wirings 31 which are connected to a second gate electrode (not shown) of another semiconductor device is connected to the second gate electrode 18 of the semiconductor device shown. The wirings 31 may be formed integrally with and of the second gate electrode 18 or may be made of other material.

As described above, the two-layered gate structure for the semiconductor device 1 is thus formed with the first gate electrode 16 and the second gate electrode 18.

In the structure of the two-layered structure of the above-described semiconductor device 1, the top surface 16*a* of the first gate electrode 16 is substantially flush with the top surface 116*a* of the planarizing insulating layer 116. In addition, the second gate insulating layer 17 and the second gate electrode 18 are formed on the top surface 16*a* of the first gate electrode 16. Accordingly, the formation of the capacitance among the first gate electrode 16, the second gate insulating layer 17 and the second gate electrode 18 is limited on the top surface 16_a_ of the first gate electrode 16. Accordingly, there is no concentration of the electric field at top corner portions 16_b_ and 16_c_ of the first gate electrode 16 on both sides.

In the case where the wirings 31 connected to the second gate electrodes 18 are formed, the wirings 31 are formed on the planarizing insulating layer 116. For this reason, since the capacitance is not formed between the wirings 31 and the first gate electrode 16, there is no concentration of the electric field to the upper corner portions 16_b_ and 16_c_ of the first gate electrode 16 on both sides.

Accordingly, if the thus constructed semiconductor device 1 is applied to memory cells of the non-volatile storage device, it is possible to enhance the data holding capacity of the non-volatile storage device.

Also, as shown in a cross-section in a gate longitudinal direction, source/drain regions 19 and 20 are provided on the semiconductor substrate 11 of the element formation region 12 on both sides of the first gate electrode 16.

The semiconductor device in which the source/drain regions 19 and 20 are thus formed serves as a non-volatile storage element 2 (such as EPROM, EEPROM or the like).

Namely, the first gate electrode 16 of the semiconductor device serves as a floating gate 21 of the non-volatile storage element 2 and the second gate electrode 18 serves as a control gate electrode 22 thereof.

Also, if a plurality of non-volatile storage elements having the above-described structure are arranged laterally and longitudinally in a surface of the semiconductor substrate 11, it is possible to constitute a memory matrix for the non-volatile storage device.

A method for manufacturing the two-layered structure for the above-described semiconductor device will now be described with reference to FIGS. 9A to 9E and FIGS. 10A to 10D. FIGS. 9A to 9E and FIGS. 10A to 10C are cross-sectional views of the semiconductor device in the gate width direction. FIG. 10D is a view of the semiconductor device in a gate longitudinal direction. In those drawings, the same reference numerals are used to denote the same components as shown in FIG. 7.

Figure 9A:
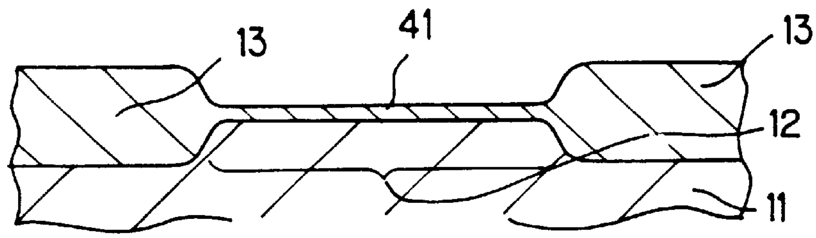
FIGS. 9A to 9E are cross-sectional views of the non-volatile storage element in the gate width direction which is produced according to another method of the invention.

As shown in FIG. 9A, the element formation region 12 is set on the semiconductor substrate 11. The semiconductor substrate is made of, for example, silicon.

In a first step, the element isolation region 13 is formed around the element formation region 12 on the top surface of the semiconductor substrate 11. After a pad oxidized layer 41 has been formed on the surface of the semiconductor substrate 11, for example, the element isolation region 13 is formed by a LOCOS method or an improved LOCOS method in which a silicon nitride layer is used as an oxidation preventing layer (not shown). For this reason, the top surface of the element isolation region 13 is formed at a higher level than that of the surface of the semiconductor substrate 11.

Thereafter, the silicon nitride layer (not shown) which has been used in the LOCOS method is removed by, for example, a wet etching or a dry etching process. Incidentally, the pad oxidized layer 41 which has been used in the LOCOS method may be left without any adverse affect.

Figure 9B:
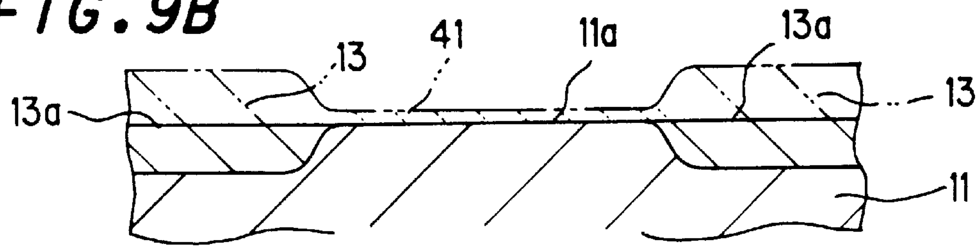

Subsequently, as shown in FIG. 9B, by a precision polishing method, the portions indicated by two-dotted and dash lines of the element isolation region 13 and the pad oxidized layer 41 (indicated by dotted lines) are removed. This polishing is effected until the surface 13_a_ of the element isolation region 13 is substantially in common plane of the surface 11_a_ of the semiconductor substrate 11.

In this case, it is preferable to use as the polishing method a chemical mechanical polishing so as to suppress the damage of the semiconductor substrate 11 because the semiconductor substrate 11 is exposed outside.

Incidentally, the polishing is not limited to the chemical mechanical polishing but may be attained by any other suitable polishing methods such as a chemical polishing or a mechanical polishing or the like.

Figure 9C:
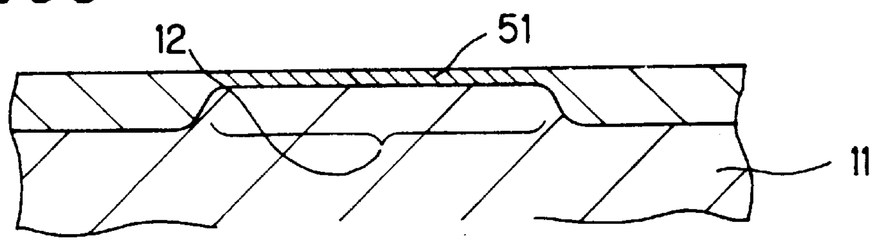

Next, a second step shown in FIG. 9C is carried out. In this step, by, for example, a heat oxidation method, a first insulating layer 51 is formed on the above-described element formation region 12 of the semiconductor substrate 11.

Figure 9D:
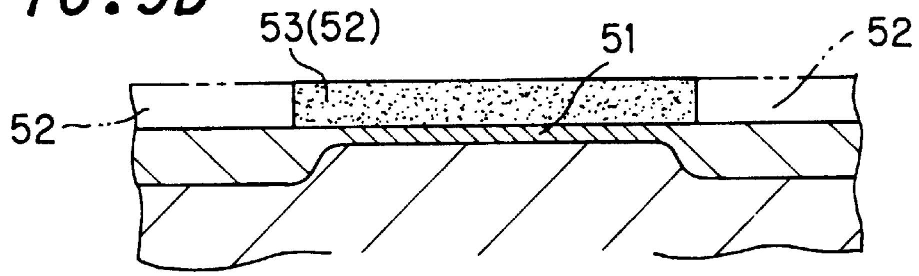

Furthermore, a third step shown in FIG. 9D is carried out. In this step, by a CVD (chemical vaporization deposition) method, a first electrode formation layer 52 is formed so as to cover the first gate insulating layer 51. The first electrode formation layer 52 is made of, for example, polycrystalline silicon.

Thereafter, by a lithographic technology and an etching process, the portion, indicated by the two-dot and dash lines, of the first electrode formation layer 52. Then, the electrode pattern 53 is formed by the first electrode formation layer (52) so as to cover the element formation region 12.

Figure 9E:
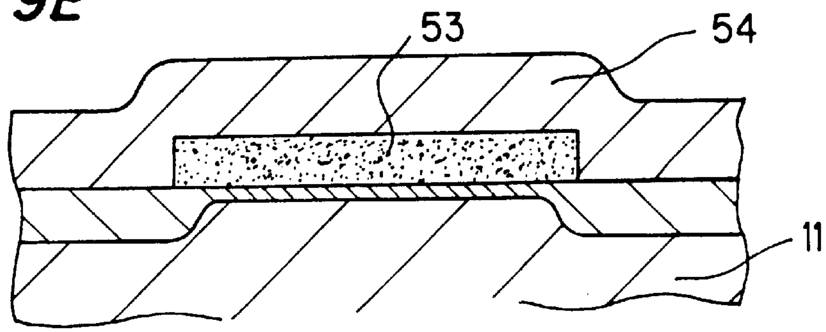

Thereafter, a fourth step shown in FIG. 9E is carried out. In this step, by, for example, the CVD method, a second insulating layer 54 which is at least thicker than the electrode pattern 53 is formed so as to cover the electrode pattern 53.

Figure 10A:
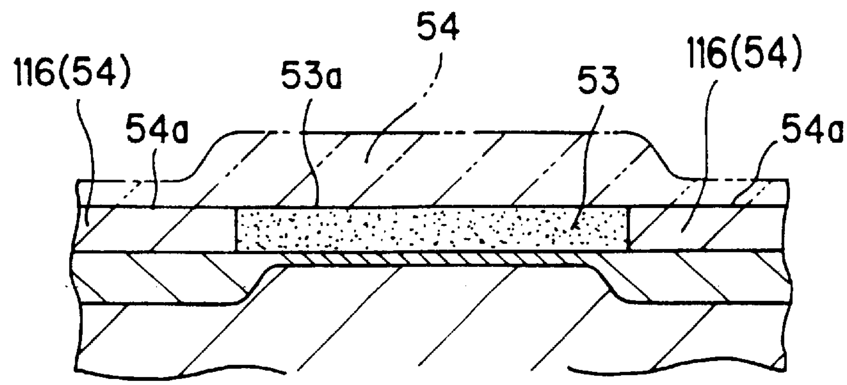
FIGS. 10A to 10C are cross-sectional views of the non-volatile storage element in the gate width direction which is subsequently produced according to the method of the invention.

Subsequently, as shown in FIG. 10A, by, for example, the polishing method, the portion indicated by two-dotted and dash lines of the second insulating layer 54 is removed until the top surface 53_a_ of the electrode pattern 53 is exposed outside. Thus, the top surface 53_a_ of the electrode pattern 53 and the surface 54_a_ of the second insulating layer 54 are substantially flush with each other. The second insulating layer (54) becomes the planarizing insulating layer 116.

In this case, it is preferable to use as the polishing method a chemical mechanical polishing. However, the polishing is not limited to the chemical mechanical polishing but may be attained by any other suitable polishing methods such as a chemical polishing or a mechanical polishing or the like.

As another planarizing method, for example, after a planarizing layer (not shown) which has substantially the same etching speed as that of the second insulating layer 54 has been formed on the second insulating layer 54, the regular etch-back process is carried out. The fattening layer is removed until the top surface 53_a_ of the electrode pattern 53 is exposed outside, and at the same time, the top layer of the second insulating layer 54 is removed. Thus, as described in conjunction with FIG. 10A, the second insulating layer 54 is left so that the top surface 54_a_ of the second insulating layer 54 is substantially flush with the top surface 53_a_ of the electrode pattern 53.

Figure 10B:
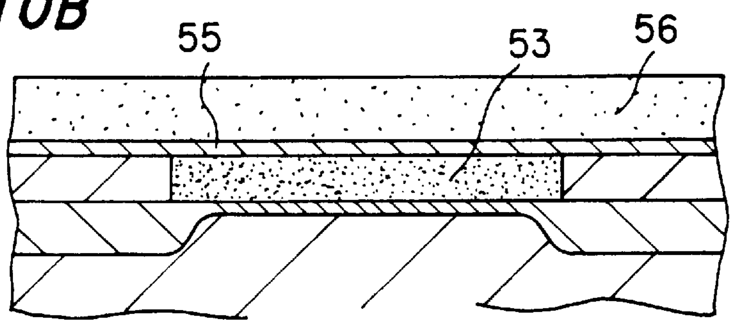

Subsequently, a fifth step shown in FIG. 10B is carried out. In this step, by, for example, a CVD method, a third insulating layer 55 is formed over an entire surface on the side of the electrode pattern 53. For instance, the third insulating layer 55 is formed in a three-layer structure (not shown) composed of a silicon oxide layer ($SiO_2$), a silicon nitride layer ($Si_3N_4$) and another silicon oxide layer ($SiO_2$). Thereafter, by, for example, a CVD method, the second electrode formation layer 56 is formed on the third insulating layer 55. The second electrode formation layer 56 is made of, for example, polycrystalline silicon.

Figure 10C:
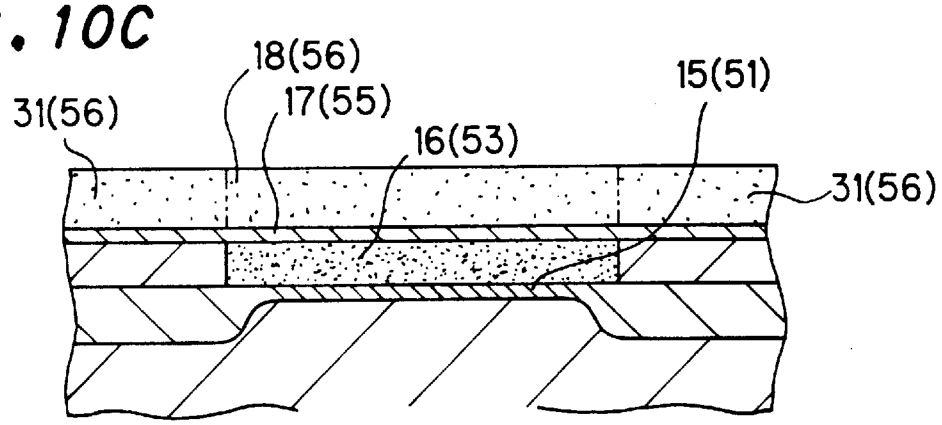
Figure 10D:
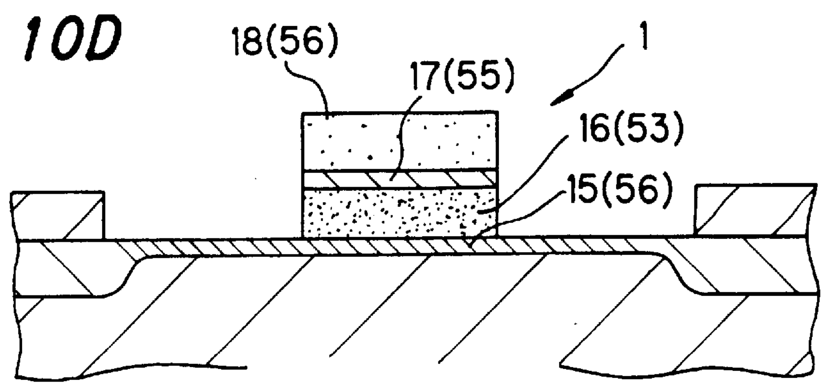
FIG. 10D is a view of the storage element in a gate longitudinal direction, corresponding to FIG. 10C.

Furthermore, a sixth step shown in FIGS. 10C and 10D is carried out. In this step, by a lithography and an etching process, the above-described second electrode formation layer 56 is patterned to form a second gate electrode 18. At the same time, the second electrode formation layer (56) forms the wirings 31. Subsequently, the above-described electrode pattern (53) is patterned to form a second gate insulating layer 17. Furthermore, the electrode pattern (53) is patterned to form a first gate electrode 16. Each of the patterning steps is carried out by using as the etching mask the resist mask (not shown) which is formed by the lithography, for example.

Thus, the two-layered gate structure is formed for the semiconductor device.

Figure 11:
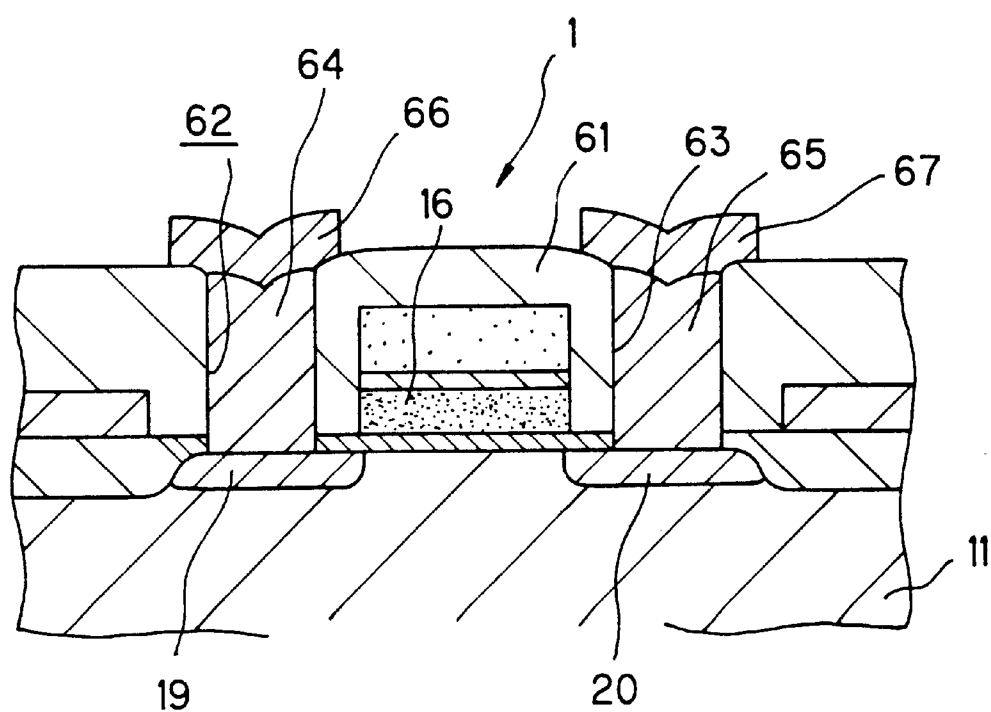
FIG. 11 is a schematic cross-sectional view showing a step of the method for producing a source/drain structure of the storage element shown in FIGS. 10C and 10D.

As shown in FIG. 11, after the sixth step has been carried out, by, for example, an ion injection method, conductive impurities are introduced into the semiconductor substrate 11 on both sides of the above-described gate electrode 16 to form a source/drain structure 19 and 20.

Subsequently, a layer interval insulating layer 61 is formed by, for example, a CVD method.

After that, by a lithography and an etching process, contact holes 62 and 63 are formed in the layer interval insulating layer 61 and the first insulating layer 51. Subsequently, by, for example, a plug formation method using a blanket tungsten, including the layer formation through the CVD method and the etching process, tungsten plugs 64 and 65 are formed within the contact holes 62 and 63. Thereafter, after the formation of the wiring layer (not shown), by patterning the wiring layer, the wirings 66 and 67 which are connected to the source/drain 19 and 20 through the tungsten plugs 64 and 65 are formed. The material to be filled in the contact holes 62 and 63 is not limited to the tungsten but any material may be used if it is conductive.

In the method for manufacturing the two-layered structure for the semiconductor device 1, the top layer of the second insulating layer 54 is removed until the top surface 53*a* of the electrode pattern 53 which forms the first gate electrode 16 is made substantially flush with the top surface 54*a* of the second electrode 54 formed to cover the top surface 53*a*. Namely, the planarizing is effected. Accordingly, since the third insulating layer 55 and the second electrode formation layer 55 to be formed next are formed on the planar surface, the third insulating layer 55 and the second electrode formation layer 56 are formed not to cover the corner edge portions of the electrode pattern 53.

Also, since the planarizing is carried out by the chemical mechanical polishing in the fourth step, the top surface 53*a* of the electrode pattern 53 and the top surface 54*a* of the second insulating layer 54 are made substantially in a common plane. At the same time, since the surface of the semiconductor substrate 11 is planarized, the coverage property for the subsequent formation of the layer may be enhanced.

Incidentally, since the surface 13*a* of the element isolation region 13 is formed to be substantially flush with the surface 11*a* of the semiconductor substrate 11, the top surface 53*a* of the electrode pattern 53 formed on the element formation region 12 may be formed flat. For this reason, when the top layer of the second insulating layer 54 is removed by polishing after the second insulating layer 54 is formed so as to cover the electrode pattern 53, there is no second insulating layer 54 on the electrode pattern 53. Accordingly, since the third insulating layer 55 formed on the electrode pattern 53 to have a desired thickness, when the third insulating layer 55 is used as the second gate insulating layer 17, it is possible to obtain a predetermined capacity.

In the foregoing method, the element isolation region 13 is formed by the LOCOS method or the improved LOCOS method but it is possible to form the element isolation region by, for example, a trench structure. The specific method will be explained with reference to FIGS. 12A and 12B in which the same reference numerals are used to designate the same components as shown in FIGS. 9A to 9E and FIGS. 10A to 10D.

Figure 12A:
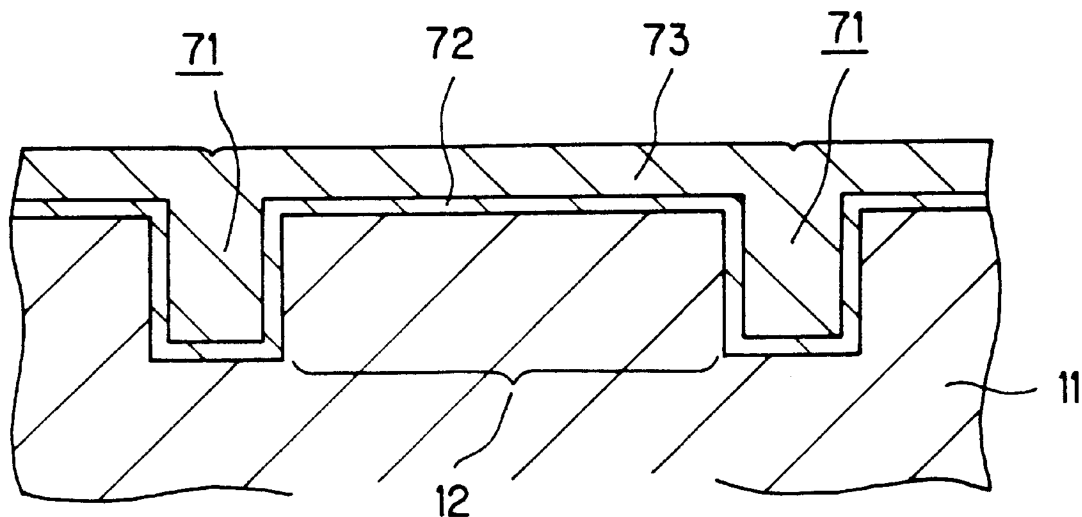
FIGS. 12A and 12B are cross-sectional views of a non-volatile storage element in the gate width direction which is produced according to still another method of the invention.

As shown in FIG. 12A, the element formation region 12 is set on the semiconductor substrate 11. The semiconductor substrate is made of, for example, silicon.

First of all, a trench 71 is formed around the element isolation region 12 and in the semiconductor substrate 11 by a lithography and an etching process.

In accordance with the heat oxidation method, the surface of the semiconductor substrate 11 including inner walls of the trench 71 are oxidized to form an oxidation layer 72. Thereafter, by a CVD method, an insulating layer 73 is formed to fill the interior of the trench 71. The insulating layer 73 is made of, for example, silicon oxide.

Figure 12B:
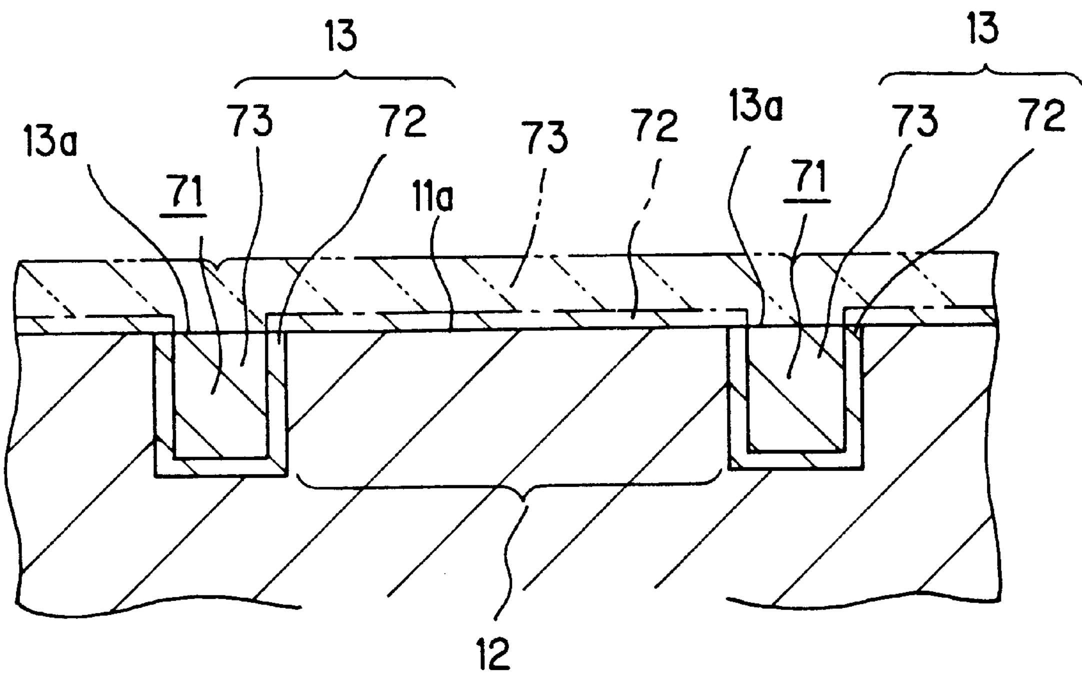

Subsequently, as shown in FIG. 12B, by a precision polishing method, the portions indicated by two-dotted and dash lines of the insulating layer 73 and the oxidized layer 72 (indicated by one dot and dash lines) are removed. Then, the element isolation region 13 composed of the insulating layer 73 and the oxidized layer 72 is formed in the interior of the trench 71. This polishing is effected until the semiconductor substrate 11 of the element isolation region 12 is exposed outside so that the surface 13*a* of the element isolation region 13 is substantially in common plane of the surface 11*a* of the semiconductor substrate 11.

In this case, it is preferable to use the polishing so as to suppress the damage of the semiconductor substrate 11. For example, it is preferable to use a chemical mechanical polishing as the polishing treatment.

Incidentally, the polishing is not limited to the chemical mechanical polishing but may be attained by any other suitable polishing methods such as a chemical polishing or a mechanical polishing or the like.

As described above, by adopting the trench structure for the element isolation region 13, it is possible to decrease an area of the element isolation region 13 relative to the semiconductor substrate 11.

In the method for forming the element isolation region explained in conjunction with FIGS. 12A and 12B, since the oxidized layer 72 is formed by the oxidation method after the trench 71 has formed in the semiconductor substrate 11, the insulating property of the element isolation region 13 may be enhanced. Also, the top surface 13*a* of the element isolation region 13 is substantially flush with the top surface 11*a* of the semiconductor substrate 11. Accordingly, it is possible to apply the two-layered gate structure of the semiconductor device to the element isolation region having the trench structure.

As described above, according to one aspect of the invention, since the second gate insulating layer and the second gate electrode are formed on each top surface of the first gate electrode and the planarizing insulating layer which are substantially flush with each other, there is no concentration of the electric field to the upper corner portions of the first gate electrode on both sides. Also, since the second gate electrode and the wirings which are connected to the second gate electrodes are formed on the first gate electrode and the planarizing insulating layer which are substantially fattened are formed through the second gate insulating layer, there is no concentration of the electric field to the upper corner portions of the first gate electrode. As a result, since the accumulated charge amount in the first gate electrode will not change, it is possible to keep the charge holding performance at a higher level.

According to another aspect of the invention, since the above-described two-layered structure is used as the gates, there is no concentration of the electric field on the upper corner portions of the floating gate on both sides. For this reason, it is possible to enhance the charge holding performance to thereby enhance the data holding reliability.

According to still another aspect of the invention, the top layer of the second insulating layer is removed so that the surface of the electrode pattern which will become the first gate electrode is kept in the same level as that of the second insulating surface which covers the electrode pattern, the planarizing is carried out. Accordingly, it is possible to form the third insulating layer and the second electrode formation layer on the planarized surface.

According to still another aspect of the invention, since the top layer of the second insulating layer is removed by the chemical mechanical polishing, it is possible to form the electrode pattern and the second insulating layer to be substantially flush with each other.

Various details of the invention may be changed without departing from its spirit nor its scope. Furthermore, the foregoing description of the embodiments according to the present invention is provided for the purpose of illustration only, and not for the purpose of limiting the invention as defined by the appended claims and their equivalents.

What is claimed is:

1. A method for producing a semiconductor device, comprising the following steps of:

(a) after an element isolation region is formed around an element formation region on a top layer of said element formation region formed in a semiconductor substrate, forming a surface of said semiconductor substrate and a surface of said element isolation region which are substantially flush with each other;

(b) forming a first insulating layer at least on said element formation region;

(c) after forming a first electrode formation layer on said first insulating layer, forming an electrode pattern by said first electrode formation layer on said element formation region;

(d) after forming a second insulating layer on said semiconductor substrate so as to cover said electrode pattern, removing a top layer of said second insulating layer until a top surface of said electrode pattern is substantially flush with a top surface of said second insulating layer, and forming a planarizing insulating layer by said second insulating layer;

(e) after forming a third insulating layer at least on the top surface of said electrode pattern, forming a second electrode formation layer on said third insulating layer; and (f) forming a second electrode by patterning said second electrode formation layer, subsequently forming a second gate insulating layer by patterning said third insulating layer, and thereafter, forming a first gate electrode by patterning said electrode pattern;

wherein, any edges of any electrodes are not located on the element isolation layer, and the insulating layer surrounding the first gate electrode has vertical edges.

2. The method according to claim 1, wherein after the completion of the steps (a), (b) and (c), the step (d) comprises the following substep of, after the formation of said second insulating layer on said semiconductor substrate so as to cover said electrode pattern, removing a top layer of said second insulating layer by a chemical mechanical polishing until the top surface of said electrode pattern is substantially flush with the top surface of said second insulating layer to form said planarizing insulating layer by said second insulating layer, and after that, the steps (e) and (f) are carried out.

3. A method for producing a semiconductor device, comprising:

(a) forming an element isolation region around and on an element formation region formed in a semiconductor substrate;

(b) forming a stepped portion by removing an upper portion and/or a part of said element isolation region so that a substantially vertical edge is formed;

(c) forming a first gate insulating layer on said element formation region of said semiconductor so that said first gate electrode has at least one substantially vertical edge adjacent and in physical contact with a substantially vertical edge of the element isolation region;

(d) after forming an electrode formation layer so as to cover said stepped portion and said first gate insulating layer, removing said first electrode formation layer by using said element isolation region as a stopper until a top surface of said first electrode formation layer is substantially flush with a top surface of said element isolation region;

(e) after forming an electrode interval insulating layer on said first electrode formation layer, forming a second electrode formation layer on said electrode space insulating layer; and (f) forming a second gate electrode by patterning said second electrode formation layer, subsequently forming a second gate insulating layer by patterning said electrode space insulating layer, and further forming a first gate electrode by patterning said first electrode formation layer.

* * * * *